(12) United States Patent  (10) Patent No.: US 7,560,935 B2
Morimoto  (45) Date of Patent: Jul. 14, 2009

(54) GROUND-FAULT RESISTANCE MEASUREMENT CIRCUIT AND GROUND-FAULT DETECTION CIRCUIT

(75) Inventor: Naohisa Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 259 days.

(21) Appl. No.: 11/699,425

(22) Filed: Jan. 30, 2007

(65) Prior Publication Data

US 2007/0176604 A1  Aug. 2, 2007

(30) Foreign Application Priority Data

Jan. 30, 2006 (JP) ............... 2006-020063

(51) Int. Cl.
G01R 31/08  (2006.01)

(52) U.S. Cl. ............... 324/525; 324/503; 324/509; 361/42

(58) Field of Classification Search ............... 324/522, 324/503, 509, 525
See application file for complete search history.

(56) References Cited

U.S. PATENT DOCUMENTS 6,992,490 B2  1/2006 Nomoto et al.

FOREIGN PATENT DOCUMENTS

| JP | 8-70503 | 3/1996 |
| JP | 2004-325381 | 11/2004 |
| WO | WO 9119205 A1 * | 12/1991 |

* cited by examiner

Primary Examiner—Vincent Q Nguyen
(74) Attorney, Agent, or Firm—McDermott Will & Emery LLP

(57) ABSTRACT

There is a ground-fault resistance measurement circuit which measures a ground-fault resistance between a conductive frame body of electrical equipment and a charge section insulated from the frame body. This ground-fault resistance measurement circuit includes: a capacitor which is connected between the charge section and the frame body; a switch which opens and closes a connection path between the charge section and the capacitor; a charging unit which charges the capacitor to a predetermined voltage; a voltage measurement section which measures a charging voltage of the capacitor; a discharge control section which connects the capacitor and the charge section after the capacitor is charged, and discharges the capacitor; and a calculation section which calculates a resistance between the charge section and the frame body, based on a change in the charging voltage of the capacitor.

15 Claims, 8 Drawing Sheets

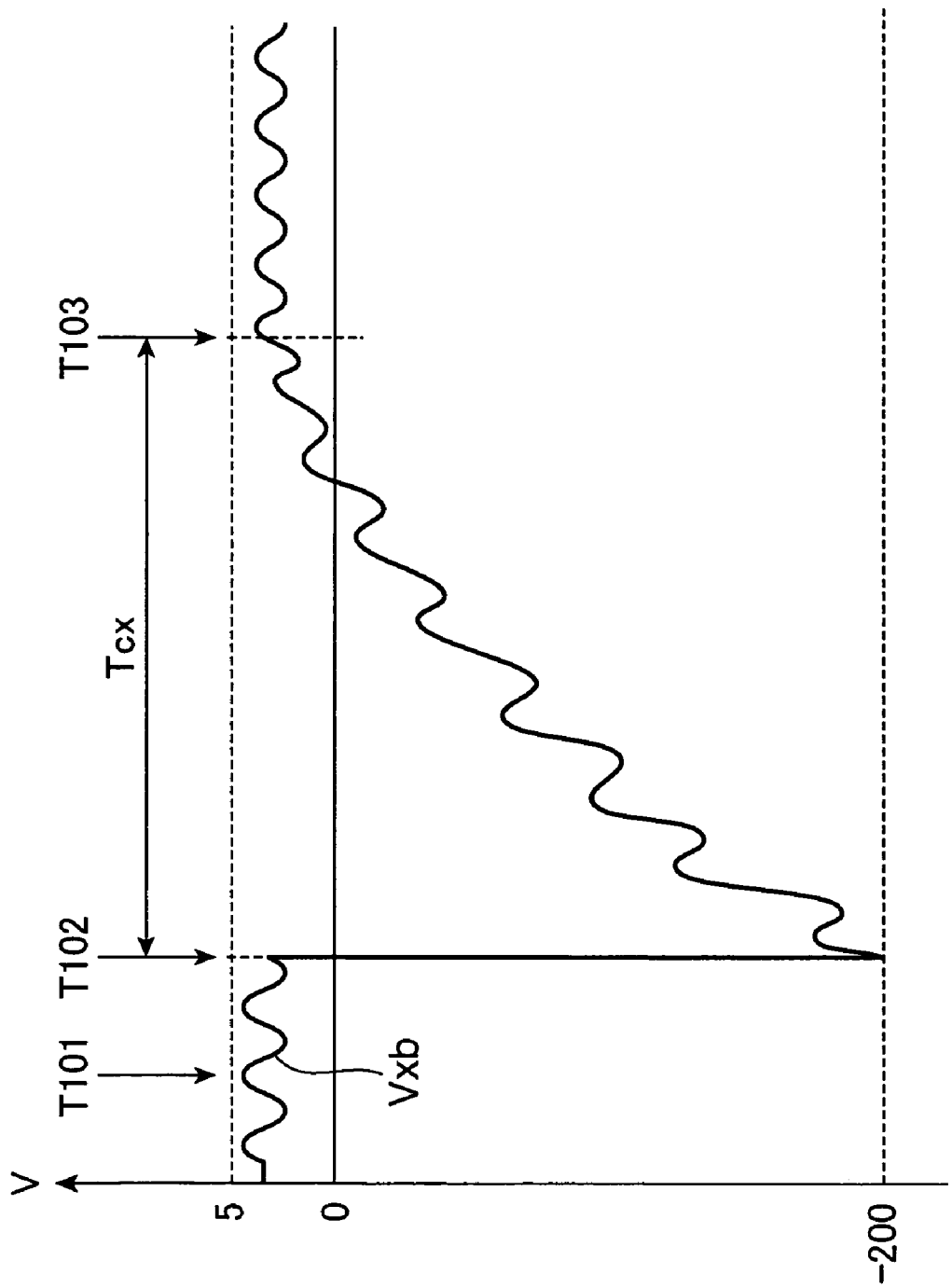

GROUND-FAULT RESISTANCE MEASUREMENT CIRCUIT AND GROUND-FAULT DETECTION CIRCUIT

BACKGROUND OF THE INVENTION

1. Field of the Invention

The present invention relates to a ground-fault resistance measurement circuit which measures a ground-fault resistance between a charge section insulated from a conductive frame body of electrical equipment and the frame body. It also relates to a ground-fault detection circuit provided with this.

2. Description of the Background Art

In recent years, hybrid cars have been widely popular which have both an engine and an electric motor. Along with this, electric cars, such as a fuel-battery vehicle, have also been put to more use. Such a vehicle which has an electric motor as its power source includes a high-voltage power source for driving the motor. In order to prevent a user from touching the vehicle's body and getting an electric shock, a charge section connected to the part of the high-voltage power source is insulated from the body. In this specification, the "charge section" means a "live part" defined in JIS B 9960-1 (the safety of machinery-a machine's electrical apparatus: general requirements). Specifically, it means a part which corresponds to "a conductor and a conductive part to which a voltage is applied in a normal usage state. They include a neutral conductor, but they do not usually include a PEN conductor (i.e., a protective conductor and an earth conductor which has the function of a neutral conductor)".

In such a vehicle provided with a high-voltage part, a resistance value is measured between the charge section and the vehicle's body. If a ground fault is caused, the resistance drops between the charge section and the body. Then, a ground-fault detection circuit detects this drop in the resistance and notifies a user. A ground fault occurs, for example, when the covering of a cable is broken and it comes into contact with the vehicle body.

FIG. 6 is a circuit diagram, showing a schematic configuration of an electric circuit and a ground-fault resistance measurement circuit according to the background art used in such an electric automobile as described above, like a hybrid car or a fuel-battery vehicle (e.g., refer to Japanese Patent Laid-Open No. 2004-325381 specification). In each figure described below, component elements are identical with each other if given the same reference characters and numerals. Thus, their description is omitted.

A vehicle 101 shown in FIG. 6 includes: a motor 102; a secondary battery pack 103 which is formed by connecting a plurality of secondary batteries in series and outputs a high voltage of, for example, approximately 288 to 900 volts; and an inverter 104 which converts a direct-current voltage outputted from the secondary battery pack 103 into three-phase power-source voltages U, V, W for driving the motor 102. The secondary battery pack 103 is insulated from the vehicle 101's body, so that a user can be prevented from getting an electric shock.

In addition, the vehicle 101 includes a voltage monitoring circuit 105 which monitors an output voltage of the secondary battery pack 103, so as to control the charge and discharge of the secondary battery pack 103 and control the operation of the inverter 104 in response to the secondary battery pack 103's output voltage. To the voltage monitoring circuit 105, a power-source voltage for its operation is supplied by a secondary battery 106. This secondary battery 106 is provided separately from the secondary battery pack 103 and is formed by, for example, a 12-volt lead storage battery for a low-voltage system. The secondary battery 106 is connected at its negative electrode to a vehicle body 107, and the vehicle body 107 is set at the ground.

Thereby, the secondary battery pack 103 is connected via the internal resistances of the voltage monitoring circuit 105 to the vehicle body 107.

Furthermore, the vehicle 101 includes a ground-fault resistance measurement circuit which measures a resistance value between the charge section and the vehicle body so as to detect a drop in insulation resistance which may be caused by a ground fault or the like as described above. The ground-fault resistance measurement circuit is formed by a constant-current source 109 and a voltmeter 110. The constant-current source 109 feeds a constant direct current I from the positive electrode of the secondary battery pack 103 through a resistance 108 to the negative electrode of the secondary battery pack 103. The constant direct current I is set at a current value below a human-body sensible current, for example, 1 mA. If a ground fault is not produced, an electric current $I_1$ which passes through the resistance 108 is almost equal to the direct current I. The voltage between both ends of the resistance 108 is measured by the voltmeter 110.

For example, if a ground fault causes the negative electrode of the secondary battery pack 103 to come into contact with the vehicle body 107, a resistance 111 generated by the ground fault is connected in parallel with the resistance 108. In FIG. 6, the resistance 108 is a resistance for measuring, using the voltmeter 110, a change in the electric current which is split by the resistance 11 as a change in the voltage. Thereby, the direct current I splits to the resistance 108 and the resistance 111, thus reducing the electric current $I_1$ and then dropping the voltage measured by the voltmeter 110. This drop in the measured voltage by the voltmeter 110 helps detect a drop in insulation resistance which is caused by trouble such as a ground fault.

FIG. 7 is a circuit diagram, showing a schematic configuration of another electric circuit and a ground-fault resistance measurement circuit according to the background art used in such an electric automobile as described above, including a hybrid car and another vehicle (e.g., refer to Japanese Patent Laid-Open No. 8-70503 specification). In the same way as the vehicle 101 shown in FIG. 6, a vehicle 120 shown in FIG. 7 includes: a motor 102; a secondary battery pack 103; an inverter 104; a voltage monitoring circuit 105; a secondary battery 106; and a resistance 108. The secondary battery 106 is grounded via a vehicle body 107. Besides, the vehicle 120 includes aground-fault resistance measurement circuit 121 which measures a ground-fault resistance value Rx corresponding to the resistance value between an electrode of the secondary battery pack 103 and the vehicle body 107. In FIG. 7, the resistance 108 indicates a resistance which is produced by the internal resistances or the like of the voltage monitoring circuit 105.

The ground-fault resistance measurement circuit 121 is provided with a buffer 122 which supplies an alternating voltage Vx via a resistance 123 and a capacitor 124 to the negative electrode of the secondary battery pack 103, and a voltage measurement circuit 126 which measures, via a resistance 125, a voltage at the connection point of the capacitor 124 and the resistance 123. Then, the alternating voltage Vx outputted from the buffer 122 is supplied to the vehicle body 107, through the resistance 123, the capacitor 124 and the resistance 108.

Thereby, the alternating voltage Vx is divided by the series impedance consisting of the resistance 108 and the capacitor 124, and the resistance 123. Then, a division voltage value Vxb is measured by the voltage measurement circuit 126.

Herein, if a ground fault takes place, the negative electrode of the secondary battery pack 103 is connected via a resistance 111 to the vehicle body 107. Thereby, the resistance 111 is connected in parallel with the resistance 108, so that a change is made in the ratio at which the alternating voltage Vx is divided. This also changes the division voltage value Vxb which is measured by the voltage measurement circuit 126. In other words, the division voltage value Vxb varies according to the ground-fault resistance value Rx which corresponds to the parallel resistance of the resistance 108 and the resistance 111. Therefore, based on the division voltage value Vxb, the ground-fault resistance value Rx can be measured. If the ground-fault resistance value Rx is below a predetermined threshold value, for example, 100 kΩ, then a drop in insulation resistance which is caused by trouble such as a ground fault is supposed to be detected.

As shown in FIG. 6, the direct current I is sent to the resistance 108 and the resistance 111, so that a ground fault is detected through the resistance 111. In such a configuration, in order to prevent a user from getting an electric shock when touching the vehicle body 107, the constant-current source 109 needs to be used in supplying the direct current I, so that the direct current I becomes a current value below a human-body sensible current. However, this presents a disadvantage in that a constant-current circuit like the constant-current source 109 makes the circuit configuration complicated. Besides, when the constant-current source 109 feeds the direct current I below a human-body sensible current, if a user touches the vehicle body 107, then the direct current I may continue flowing inside of the user's body for a long time without noticing it. This is undesirable.

In the ground-fault resistance measurement circuit 121 shown in FIG. 7, even if a ground fault is not generated, the ground-fault resistance value Rx is equivalent to the resistance 108's resistance value, for example, a resistance value of about 500 kΩ. In terms of a fuel-battery vehicle, water is generated in a fuel battery, so that the resistance 108's resistance value tends to drop. Thus, the ground-fault resistance value Rx becomes, for example, some 300 kΩ. On the other hand, if the output voltage of the secondary battery pack 103 is, for example, 600 volts, then in order to detect a ground fault which allows a human-body sensible current of 3 mA to flow, the occurrence of this ground fault needs detecting when the ground-fault resistance value Rx is below 200 kΩ. As described above, even at a normal time, the ground-fault resistance value Rx is approximately 300 kΩ. Therefore, for example, if the threshold-value voltage for detecting a ground fault is set at 250 kΩ, the ground-fault resistance value Rx needs to be measured with a precision of ±50 kΩ. Hence, there is a great demand for a higher measurement precision of the ground-fault resistance value Rx.

Herein, the division voltage value Vxb measured by the voltage measurement circuit 126 is obtained from the division voltage between the series impedance consisting of the ground-fault resistance value Rx and the capacitor 124, and the resistance 123. Thus, the lower the capacitor 124's impedance is, the higher the measurement precision of the ground-fault resistance value Rx which is measured based on the division voltage value Vxb becomes.

In order to lower the capacitor 124's impedance, heightening the frequency of the alternating voltage Vx, or increasing the capacitance of the capacitor 124, can be considered. However, in the vehicle 120 shown in FIG. 7, a switching noise made by a switching operation of the inverter 104 is inputted from the inverter 104 through the capacitor 124 and the resistance 125 to the voltage measurement circuit 126. Hence, in the voltage measurement circuit 126, the inverter 104's switching noise needs to be distinguished from the alternating voltage Vx's frequency used for measuring the ground-fault resistance value Rx. Thus, the alternating voltage Vx's frequency is set at a frequency far lower than the inverter 104's switching frequency, for example, 1 to 2 Hz. This makes it difficult to heighten the alternating voltage Vx's frequency.

In addition, if the alternating voltage Vx's frequency becomes higher, a leakage current flows via an opposite capacitance which is generated between the inverter 104 or the motor 102 and the vehicle body 107. This leakage current changes the division voltage value Vxb, thereby deteriorating the measurement precision of the ground-fault resistance value Rx measured based on the division voltage value Vxb. Accordingly, there is a disadvantage in that it is difficult to improve the measurement precision of the ground-fault resistance value Rx by heightening the alternating voltage Vx's frequency and lowering the capacitor 124's impedance.

Moreover, if the capacitor 124's capacitance becomes greater, the capacitor 124's discharge current increases. Thus, a larger quantity of electric current is sent, from the capacitor 124 through the ground-fault resistance value Rx and the vehicle body 107, to the human body touching the vehicle body 107. As a result, the capacitor 124's discharge is more likely to give an electric shock. Therefore, a disadvantage arises in that it is difficult to improve the measurement precision of the ground-fault resistance value Rx by increasing the capacitor 124's capacitance and lowering the capacitor 124's impedance.

SUMMARY OF THE INVENTION

It is an object of the present invention to provide a ground-fault resistance measurement circuit which is capable of improving the measurement precision of a ground-fault resistance easily without using any constant-current circuit, and a ground-fault detection circuit provided with this.

A ground-fault resistance measurement circuit according to the present invention, which measures a resistance between a charge section insulated from a conductive frame body of an electrical apparatus and the frame body, comprising: a capacitor which is connected between the charge section and the frame body; a first switch which opens and closes a connection path between the charge section and the capacitor; a charging unit which charges the capacitor, using a predetermined set voltage for charge; a voltage measurement section which measures a charging voltage of the capacitor; a discharge control section which closes the first switch after charging the capacitor by the charging unit; and a calculation section which calculates a resistance between the charge section and the frame body, based on a change in the charging voltage measured by the voltage measurement section after closing the first switch by the discharge control section.

In the ground-fault resistance measurement circuit according to the present invention, the charging unit charges the capacitor connected between the charge section and the frame body, and the discharge control section closes the first switch. Thereby, the capacitor discharges via a ground-fault resistance between the charge section and the conductive frame body. Thus, the capacitor's charging voltage varies according to a time constant based on the capacitor's capacitance and a ground-fault resistance. Then, the voltage measurement section measures the capacitor's charging voltage. Herein, the change in the charging-voltage measurement value obtained in the voltage measurement section corresponds to the time constant based on the capacitor's capacitance and the ground-fault resistance, so that the calculation section calculates the ground-fault resistance's resistance value. In this case, the ground-fault resistance is expressed using the logarithm of the charging-voltage measurement value obtained in the voltage measurement section. Therefore, a measurement error in the charging voltage has less effect, thus helping improve the measurement precision of a ground-fault resistance easily without using any constant-current circuit.

These and other objects, features and advantages of the present invention will become more apparent upon reading of the following detailed description along with the accompanied drawings.

BRIEF DESCRIPTION OF THE DRAWINGS

FIG. 8 is a signal wave-form chart, showing an operation of another such ground-fault resistance measurement circuit according to the background art shown in FIG. 7.

DESCRIPTION OF THE PREFERRED EMBODIMENTS

Figure 1:
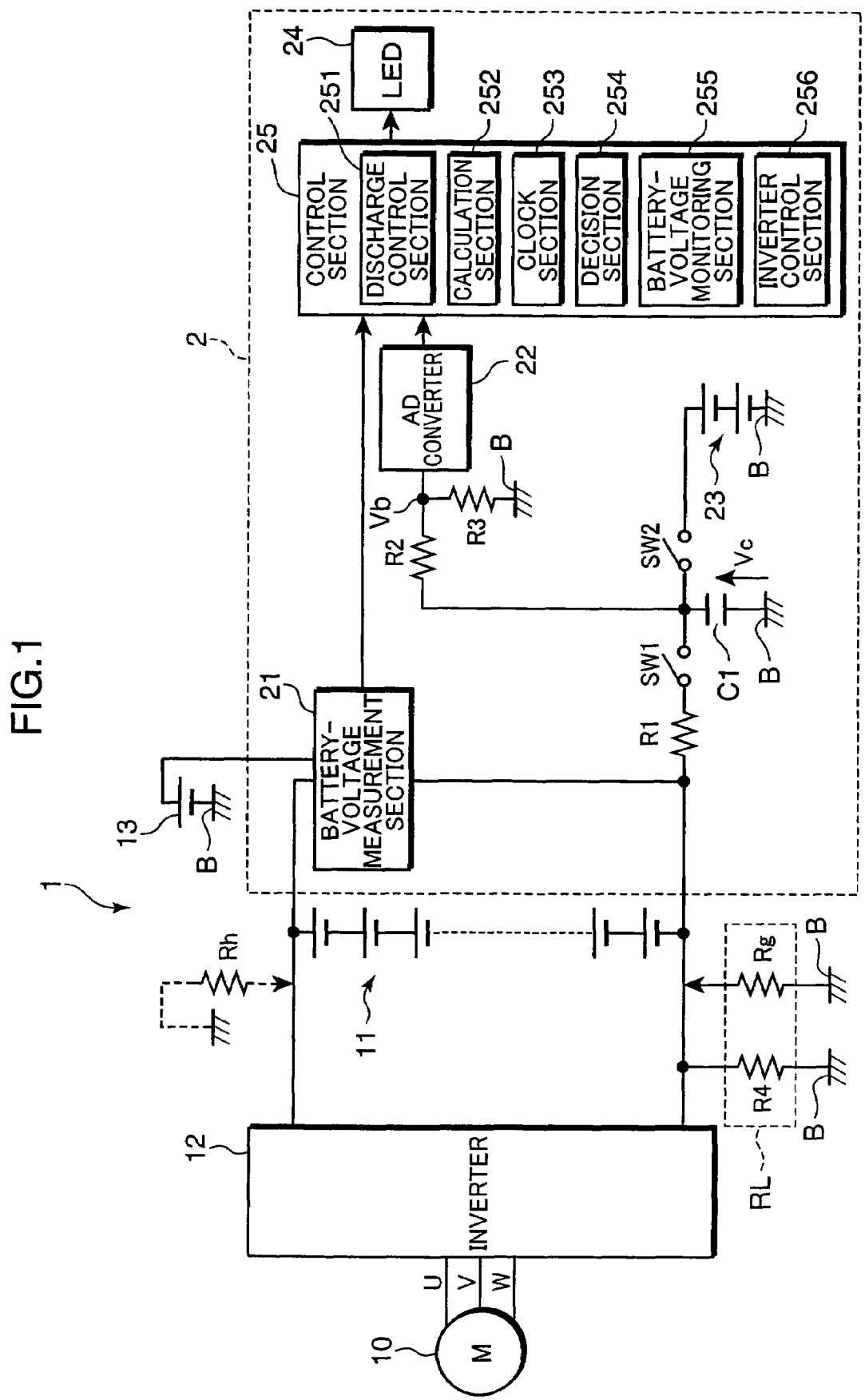
FIG. 1 is a circuit diagram, showing an example of the configuration of a ground-fault detection circuit provided with a ground-fault resistance measurement circuit according to an embodiment of the present invention.

Hereinafter, a ground-fault resistance measurement circuit according to an embodiment of the present invention will be described with reference to the attached drawings. In each figure, component elements are identical with each other if given the same reference characters and numerals. Thus, their description is omitted.

FIG. 1 is a circuit diagram, showing an example of the configuration of a ground-fault detection circuit provided with the ground-fault resistance measurement circuit according to the embodiment of the present invention. A ground-fault detection circuit 2 shown in FIG. 1 is mounted, for example, in a vehicle 1 such as an electric automobile, like a hybrid car or a fuel-battery vehicle. The ground-fault detection circuit 2 measures a resistance value $R_L$ of a ground-fault resistance RL which corresponds to a resistance between the charge section and a vehicle body B. Based on this resistance value $R_L$, it detects a ground fault being generated.

The vehicle 1 shown in FIG. 1 includes: a motor 10; a secondary battery pack 11 which outputs a high voltage of, for example, approximately 288 to 600 volts; an inverter 12 which converts a direct-current voltage outputted from the secondary battery pack 11 into three-phase power-source voltages U, V, W for driving the motor 102; and the ground-fault detection circuit 2. The secondary battery pack 11 is made up of a plurality of secondary batteries, for example, it is formed by connecting, in series, several, for example, about 240 to 500 pieces of, 1.2-volt nickel-hydrogen secondary batteries. The secondary battery pack 11 is insulated from the vehicle body B, so that a user can be prevented from getting an electric shock. In the case of a fuel-battery vehicle, the secondary battery pack 11 is replaced with a fuel battery.

The ground-fault detection circuit 2 is provided with: a battery-voltage measurement section 21; an AD converter 22 (i.e., the voltage measurement section); a charging power-source section 23; an LED (or light emitting diode) 24; and a control section 25. The negative electrode (i.e., the charge section) of the secondary battery pack 11 is connected via a resistance R1, a switch SW1 (i.e., the first switch) and a capacitor C1 to the vehicle body B (i.e., the ground). The charging power-source section 23 is a power-source section which outputs a voltage for charging the capacitor C1. For example, its negative electrode is formed by a secondary battery such as a lead storage battery which is connected to the vehicle body B. It outputs, for example, 12 volts as the set voltage for charge.

The positive electrode of the charging power-source section 23 is connected via a switch SW2 (i.e., the second switch) to the connection point of the capacitor C1 and the switch SW1. The connection point of the capacitor C1 and the switch SW1 is connected via resistances R2, R3 (i.e., the voltage-division resistance) to the vehicle body B. The connection point of the resistance R2 and the resistance R3 is connected to the AD converter 22. Thereby, a charging voltage Vc of the capacitor C1 is divided by the resistances R2, R3, and a division voltage Vb obtained from this voltage division is outputted to the AD converter 22. Then, the division voltage Vb is transformed into a digital value by the AD converter 22 and is outputted to the control section 25.

The switches SW1, SW2 are formed, for example, by a switching element, such as a bipolar transistor and an FET (or field effect transistor). They are opened (or turned off) and closed (or turned on) according to a control signal from the control section 25.

The LED 24 is, for example, a warning light provided in the instrument panel inside of the vehicle 1. It gives notice of the occurrence of a grand fault according to a control signal from the control section 25.

The battery-voltage measurement section 21 is formed, for example, by an AD converter. It measures an output voltage of the secondary battery pack 11, or an output voltage of each secondary battery which make up the secondary battery pack 11. Then, it outputs that measurement value to the control section 25.

To the battery-voltage measurement section 21, a power-source voltage for its operation is supplied by a secondary battery 13. This secondary battery 13 is provided separately from the secondary battery pack 11 and is formed by, for example, a 12-volt lead storage battery for a low-voltage system. The secondary battery 13 is connected at its negative electrode to the vehicle body B, and the vehicle body B is set at the ground of the low-voltage system. Thereby, the secondary battery pack 11 is connected via the internal resistances of the battery-voltage measurement section 21 to the vehicle body B.

In FIG. 1, a resistance R4 represents a resistance generated from the internal resistances or the like of the battery-voltage measurement section 21. A resistance Rg indicates a resistance caused by a grand fault. In this case, the ground-fault resistance RL being between the charge section and the vehicle body B is a resistance formed by connecting the resistance R4 and the resistance Rg in parallel. In terms of the resistance R4, for example, if the output voltage of the secondary battery pack 11 is 400 volts, then at a normal time (with the resistance Rg kept open), the resistance R4 is set, for example, at 500 kΩ, so that the electric current which passes through the resistance R4 becomes a current value well below a human-body sensible current (of 3 to 4 mA), for example, less than 1 mA.

The control section 25 is formed by: for example, a volatile storage element such as a CPU (or central processing unit) and an RAM (or random access memory); a non-volatile storage element such as an ROM (or read only memory); for example, a clock section 253 formed by a timer circuit; and its peripheral circuit and like. The control section 25 executes a predetermined control program, so as to function as a discharge control section 251, a calculation section 252, a decision section 254, a battery-voltage monitoring section 255, and an inverter control section 256.

The discharge control section 251 turns on (or closes) the switch SW2 with the switch SW1 kept turned off (or opened), so that the capacitor C1 can be charged by to charging power-source section 23. Thereafter, it turns off the switch SW2, which brings this charge by the charging power-source section 23 to an end. Simultaneously, the charging power-source section 23 is cut off from to capacitor C1.

After the discharge control section 251 turns on the switch SW1, the calculation section 252 calculates the resistance value $R_L$ of the ground-fault resistance RL, based on a change in the division voltage Vb outputted from the AD converter 22.

If the resistance value $R_L$ calculated by the calculation section 252 is below a predetermined threshold value set in advance, for example, 250 kΩ, the decision section 254 decides that a ground fault has been generated. Then, it outputs a control signal and lights the LED 24.

Incidentally, instead of the LED 24, a buzzer or a loudspeaker may also be used to give information on the generation of a ground fault, using a sound or a voice. Or, a display unit such as a liquid-crystal display may also be used to give notice of the occurrence of a ground fault. In that case, it can indicate a message that a ground fault has been caused.

Furthermore, the decision section 254 and the LED 24 may also be replaced with a display unit such as a liquid-crystal display. In that case, the ground-fault resistance measurement circuit is capable of displaying the ground-fault resistance RL calculated by the calculation section 252 in the display unit.

The battery-voltage monitoring section 255 monitors the output-voltage measurement value of the secondary battery pack 11 which is outputted from the battery-voltage measurement section 21. If the secondary battery pack 11's output voltage falls below a threshold-value voltage set in advance, it controls a charge circuit (not shown) so that the secondary battery pack 11 can be charged. Or, it allows a display unit (not shown) to display the fact that the secondary battery pack 11's output voltage has dropped.

The inverter control section 256 controls the operation of the inverter 12 according to the output-voltage measurement value of the secondary battery pack 11 which is outputted from the battery-voltage measurement section 21. Thereby, regardless of the output voltage of the secondary battery pack 11, the motor 10 is designed to be given a predetermined revolving speed and torque.

Figure 2:
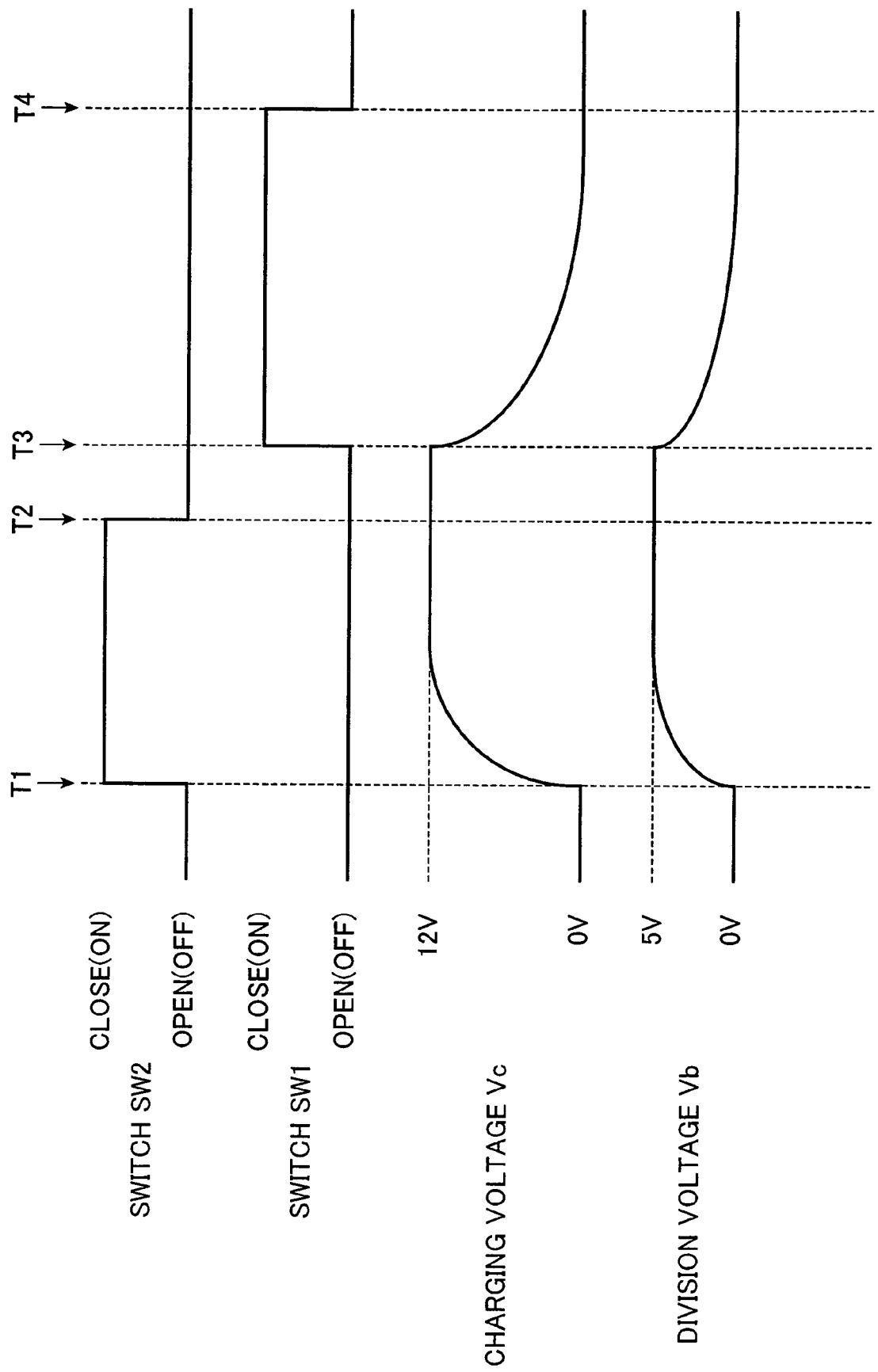
FIG. 2 is a timing chart, showing an operation of the ground-fault detection circuit shown in FIG. 1.

Hereinafter, a description will be given about an operation of the ground-fault detection circuit 2 which has such a configuration as described above. FIG. 2 is a timing chart, showing an operation of the ground-fault detection circuit 2 shown in FIG. 1. First, with the switches SW1, SW2 kept turned off, in timing T1, the switch SW2 is turned on by the discharge control section 251. Thereby, the capacitor C1 is charged by the charging power-source section 23, and thus, the charging voltage Vc of the capacitor C1 becomes 12 volts. The charging voltage Vc is divided by the resistance R2 and the resistance R3, and then, the division voltage Vb is outputted to the AD converter 22.

The ratio of the resistance R2's resistance and the resistance R3's resistance is set at, for example, 7:5. Hence, the voltage obtained by multiplying the charging voltage Vc by 5/12 is equivalent to the division voltage Vb. Therefore, as the charging voltage Vc varies from 0 to 12 volts, the division voltage Vb changes from 0 to 5 volts. This makes it possible to charge the capacitor C1 up to 12 volts at the maximum, using the AD converter 22 which has an input-voltage range of 0 to 5 volts.

In short, the resistance R2 and the resistance R3 divide the charging voltage Vc and the division voltage Vb is outputted to the AD converter 22, so that the capacitor C1 can be charged up to a voltage higher than the input-voltage range of the AD converter 22. This heightens the capacitor C1's charging voltage. As described later, therefore, the influence of a noise can be relatively reduced when the capacitor C1's electric charge is discharged through the ground-fault resistance RL.

Next, after the capacitor C1 is charged to 12 volts and this charge is completed, in timing T2, the discharge control section 251 turns off the switch SW2. Thereby, the charging power-source section 23 is separated from the capacitor C1. At the same time, the capacitor C1's electric charge is restrained from being discharged to the charging power-source section 23. This keeps the charging voltage Vc at 12 volts.

Next, in timing T3, the discharge control section 251 turns on the switch SW1. Thereby, the capacitor C1's electric charge is discharged via the switch SW1, the resistance R1 and the ground-fault resistance RL to the vehicle body B (i.e., the ground). Then, the charging voltage Vc and the division voltage Vb drop according to a discharge time constant τ of the capacitor C1.

Figure 3:
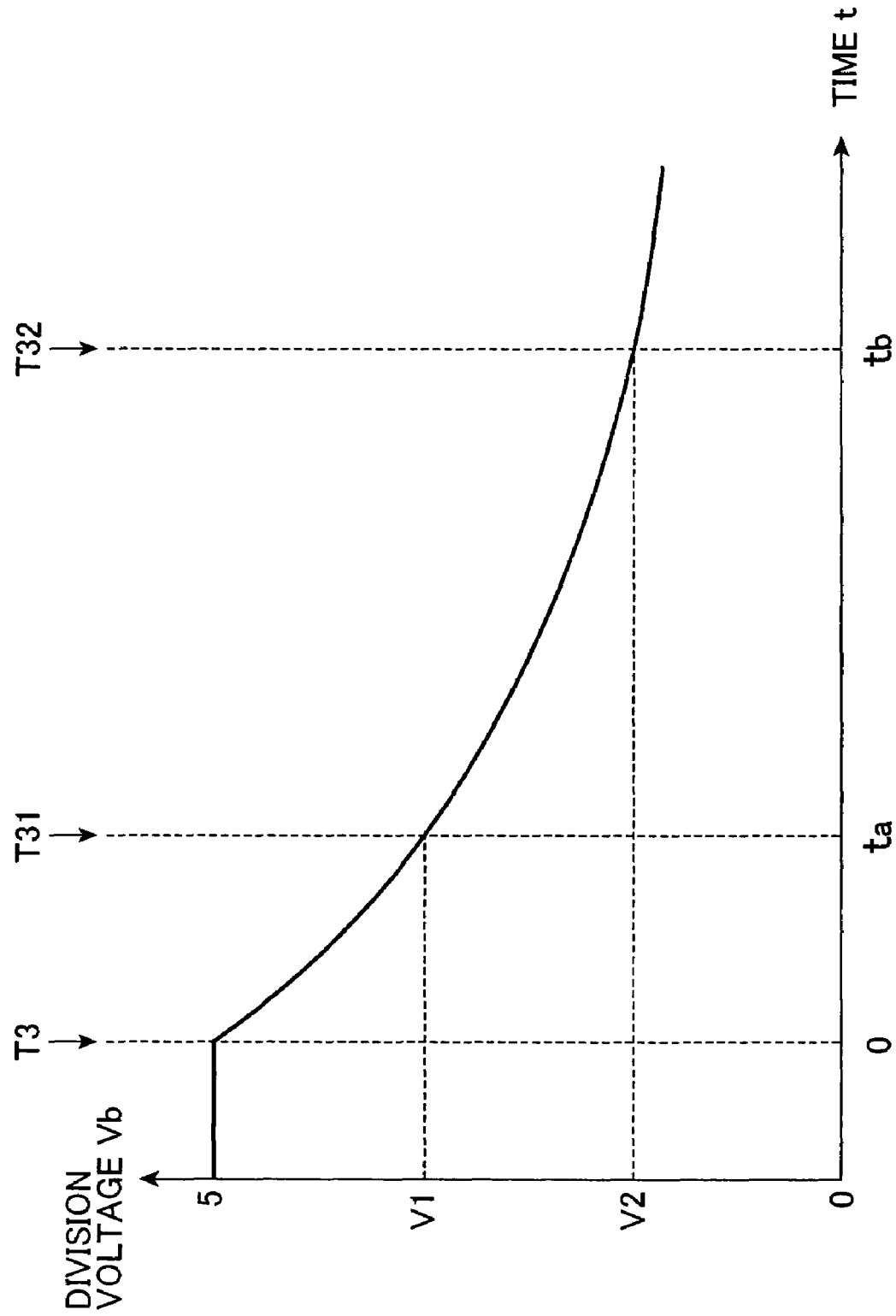
FIG. 3 is a graphical representation, showing a change in a division voltage when a capacitor C1 shown in FIG. 1 discharges.

FIG. 3 is a graphical representation, showing a change in the division voltage Vb when the capacitor C1 shown in FIG. 1 discharges. First, in the timing T3, the clock section 253 starts to clock the time which elapses. Simultaneously, the calculation section 252 begins to monitor the value of the division voltage Vb outputted from the AD converter 22. In this case, the division voltage Vb is multiplied by the reciprocal of the division-voltage ratio of the resistances R2, R3, for example, 12/5, so that the charging voltage Vc can be obtained.

The calculation section 252 samples, for example, the division voltage Vb in a fixed cycle, for example, a period of 5 msec. Thereby, it monitors the division voltage Vb's value. Incidentally, the sampling cycle for the division voltage Vb may be suitably set according to the precision required in calculating the resistance value $R_L$ of the ground-fault resistance RL. Then, in timing T31 when the division voltage Vb's value becomes a set voltage V1 determined beforehand, or below, the calculation section 252 acquires, as a time ta, the time clocked by the clock section 253. Sequentially, in timing T32 when the division voltage Vb's value becomes a set voltage V2 determined beforehand, or below, the calculation section 252 acquires, as a time tb, the time clocked by the clock section 253.

Herein, the discharge time constant τ of the capacitor C1 is given using the following expression (1).

$$\tau = (tb - ta)/(\log V1 - \log V2) \quad (1)$$

Herein, the discharge time constant τ is given based on a capacitance $C_1$ of the capacitor C1 and resistance values $R_1$, $R_2$, $R_3$ of the resistances $R_1$, $R_2$, $R_3$, using the following expression (2).

$$\tau = C_1\{(R_L+R_1)//(R_2+R_3)\} \quad (2)$$

Incidentally, a symbol "//" denotes an operator which indicates a combined resistance in a parallel connection.

The expression (2) is transformed to, $$\tau/C_1 = \{(R_L+R_1)//(R_2+R_3)\}.$$

Herein, if $R_L+R_1=R$, $R_2+R_3=Rs$, $$\tau/C_1 = R \times Rs/(R+Rs),$$

$$(Rs-\tau/C_1)\times R = \tau/C_1 \times Rs,$$

$$R = (\tau \times Rs)/(C_1 \times Rs - \tau).$$

Herein, from $R=R_L+R_1$, $Rs=R_2+R_3$, $$R_L = \tau \times (R_2+R_3)/\{C_1 \times (R_2+R_3)-\tau\}-R_1 \quad (3)$$

Incidentally, $\tau = (tb-ta)/(\log V1 - \log V2)$.

Then, based on this expression (3), using the times ta, tb and the set voltages V1, V2, the calculation section 252 calculates the resistance value $R_L$ of the ground-fault resistance RL. In this case, in the expression (3), V1, V2 are obtained from the division voltage Vb which corresponds to the division-voltage value of the charging voltage Vc of the capacitor C1, and they are used in their logarithmic forms. Therefore, the error made when the AD converter 22 measures the division voltage Vb produces a less influence on the precision of a calculation of the resistance value $R_L$. In the background art shown in FIG. 7, the frequency of the alternating voltage Vx is heightened, or the capacitance of the capacitor 124 is increased. However, in this embodiment, without executing such an operation, the precision with which the resistance value $R_L$ is calculated can be improved. This makes it easier to enhance the calculation prevision of the resistance value $R_L$.

In addition, without increasing the capacitance of the capacitor C1, the calculation precision of the resistance value $R_L$ can be easily heightened. This makes it easier to reduce the capacitor C1's capacitance while maintaining the calculation precision of the resistance value $R_L$. In this case, such a decrease in the capacitor C1's capacitance helps keep the user who has touched the vehicle body B from feeling uncomfortable because of the capacitor C1's discharge current.

Figure 6:
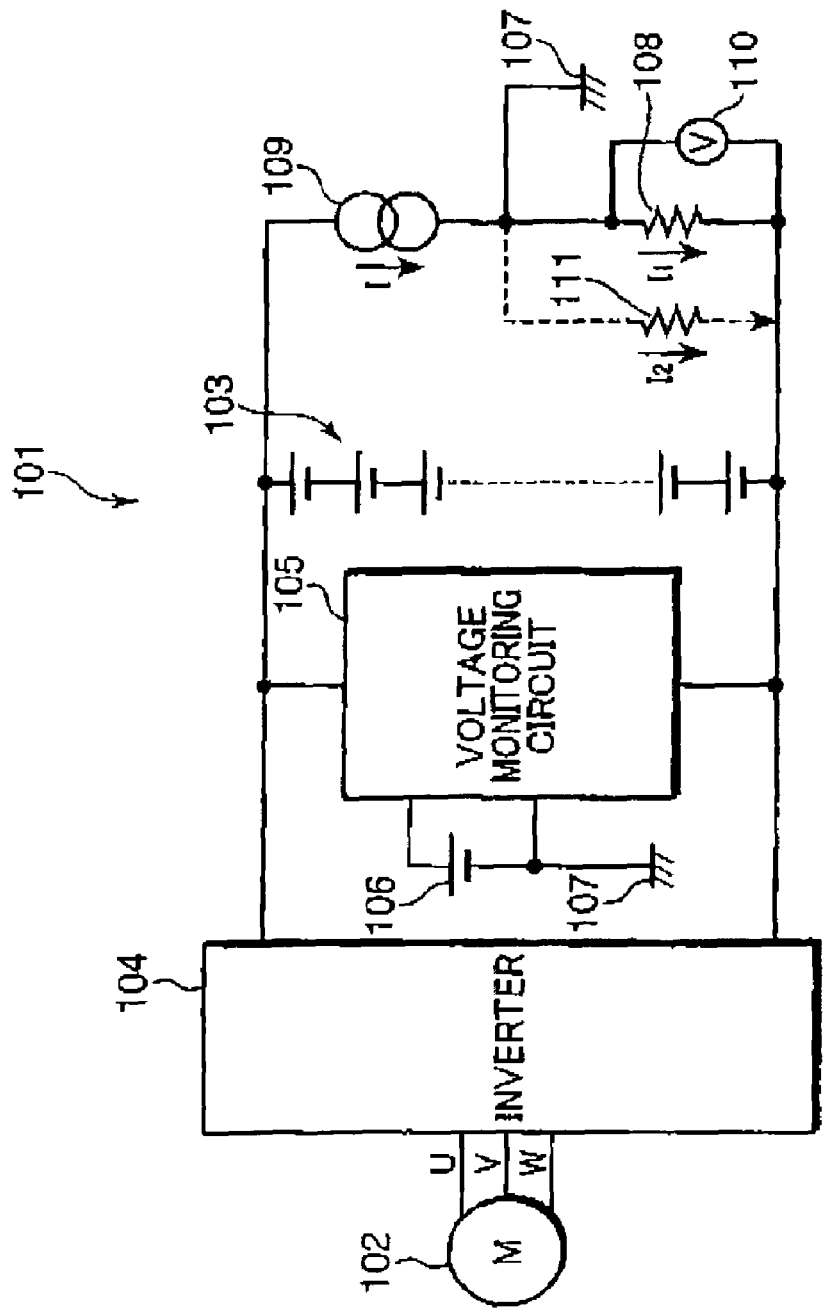
FIG. 6 is a circuit diagram, showing a ground-fault resistance measurement circuit according to the background art.

Furthermore, the resistance value $R_L$ is calculated using the capacitor C1's discharge current. In the background art shown in FIG. 6, a constant-current circuit is used, and consequently, a direct current may continue flowing. However, in this embodiment, there is no need for a constant-current circuit, and a direct current is prevented from continuing to flow. Therefore, the user who has touched the vehicle body B is less likely to feel uncomfortable because of an electric current for measuring the ground-fault resistance RL.

Moreover, the capacitor C1's discharge current is restricted by the resistance R1. Hence, even if the ground-fault resistance RL becomes an extremely-low resistance value, restrictions are placed on an electric current which passes through the user who has touched the vehicle body B. As a result, the electric current which passes through the user is less likely to make the user uncomfortable.

In addition, as described earlier, the control section 25 is provided with the battery-voltage monitoring section 255 which monitors the voltage of the secondary battery pack 11, and the inverter control section 256 which controls the inverter 12. This makes it possible to use it both as the battery-voltage monitoring section 255 and the inverter control section 256, and a circuit for executing the measurement of a ground-fault resistance and the detection of a ground fault. At the same time, the secondary battery 13 can be used as the charging power-source section 23. Therefore, in order to add the function of a ground-fault resistance measurement and a ground fault detection to such a circuit for monitoring the voltage of the secondary battery pack 11 or controlling the inverter 12, all you have to do is adding the resistances R1, R2, R3, the capacitor C1, the switches SW1, SW2 and the AD converter 22. Thereby, the ground-fault resistance measurement circuit and the ground-fault detection circuit 2 provided with this can be configured at a low cost. In this case, an electric automobile generally includes this circuit for monitoring the voltage of the secondary battery pack 11 or controlling the inverter 12. Hence, the ground-fault detection circuit 2 can be applied suitably to an electric automobile.

Incidentally, the calculation section 252 may also acquire the value of the division voltage Vb when the division voltage Vb's value falls to or below the set voltage V1 determined in advance, as Vta which is the division voltage Vb at the time ta. Then, it may also acquire the value of the division voltage Vb when the division voltage Vb's value falls to or below the set voltage V2 determined in advance, as Vtb which is the division voltage Vb at the time tb. In that case, the following expression (3) is replaced with the following expression (4).

$$R_L = \tau \times (R_2+R_3)/\{C_1 \times (R_2+R_3)-\tau\}-R_1 \quad (4)$$

Incidentally, $\tau = (tb-ta)/(\log Vta - \log Vtb)$.

If the cycle in which the calculation section 252 samples the division voltage Vb is long, then in the timing T31, T32, the division voltage Vb can be below the set voltages V1, V2. In this case, the calculation section 252 acquires Vta, Vtb over again and can calculate the resistance value $R_L$ based on Vta, Vtb. This helps reduce an error in the calculation of the resistance value $R_L$ which is caused by the sampling cycle.

Furthermore, for example, the times ta, tb are set in advance, and the division voltage Vb at the time when the times ta, tb have come may also be acquired as the voltages Vta, Vtb. In that case, the resistance value $R_L$ can be calculated using the expression (4). However, in this case, if the resistance value $R_L$ is small, then the capacitor C1's electric discharge increases, and thus, the division voltage Vb changes sharply. As a result, the capacitor C1's electric discharge may be completed before the times ta, tb elapse. If the division voltage Vb becomes 0 volts, both of the voltages Vta, Vtb or the voltage Vtb becomes 0 volts. This makes it impossible to calculate the resistance value $R_L$ in the expression (4).

In contrast, in this embodiment, the calculation section 252 calculates the ground-fault resistance RL, based on the time (tb-ta) from the timing T31 when the division voltage Vb reaches the set voltage V1 or below until the timing T32 when the division voltage Vb reaches the set voltage V2 or below, after the discharge control section 251 has turned on the switch SW1. Therefore, the voltages Vta, Vtb are less likely to be 0 volts, thus reducing the number of cases in which the resistance value $R_L$ cannot be calculated.

On the other hand, if the resistance value $R_L$ is great, then the capacitor C1's electric discharge decreases, and thus, the division voltage Vb changes gently. As a result, even when time passes from the time ta to the time tb, little difference can be made between the voltage Vta and the voltage Vtb. If this difference is small, then in the expression (4), the accuracy with which the resistance value $R_L$ is calculated may be lower.

However, in this embodiment, the calculation section 252 calculates the ground-fault resistance RL, based on the time (tb−ta) from the timing T31 when the division voltage Vb reaches the set voltage V1 or below until the timing T32 when the division voltage Vb reaches the set voltage V2 or below, after the discharge control section 251 has turned on the switch SW1. Therefore, little difference is less likely to be made between the voltage Vta and the voltage Vtb, thus lessening the possibility that the calculation precision of the resistance value $R_L$ may be lowered, even though the resistance value $R_L$ is large.

Moreover, the calculation section 252 allows the clock section 253 to start clocking the time which elapses in the timing T31. Then, in the timing T32, it may acquire, as a time tba, the time clocked by the clock section 253. In that case, in the above described expression (3) and expression (4), (tb−ta) is replaced with the time tba.

Next, moving back to FIG. 2, the description will be continued about an operation of the ground-fault detection circuit 2 according to this embodiment. In timing T4, the discharge control section 251 turns off the switch SW1, so that the capacitor C1's discharge comes to a stop. Then, the decision section 254 compares the resistance value $R_L$ calculated by the calculation section 252 with a predetermined threshold value set in advance, for example, 150 kΩ. If it is below 150 kΩ, the decision is made that a round fault has been generated. Then, a control signal outputted from the decision section 254 allows the LED 24 to light up, which informs a user that the ground fault has occurred.

In this case, the calculation precision of the resistance value $R_L$ by the calculation section 252 can be easily improved. This makes it easy to detect a ground fault with higher precision.

Incidentally, an example is given in which the negative-electrode side of the secondary battery pack 11 is subjected to a ground fault, and thereby, it is connected via the resistance Rg to the vehicle body B. However, the positive-electrode side of the secondary battery pack 11 may undergo a ground fault and thus be connected through a resistance Rh to the vehicle body B. The secondary battery pack 11's internal resistance is low, and thus, if the switch SW1 is turned on in the timing T3, the capacitor C1's discharge current is discharged to the vehicle body B, via the switch SW1, the resistance R1, the secondary battery pack 11 and the resistance Rh. As a result, in the same way as the case where the negative-electrode side of the secondary battery pack 11 is subjected to a ground fault, the ground-fault resistance RL's resistance can be calculated as the combined resistance of the resistance Rh and the resistance R4.

Figure 7:
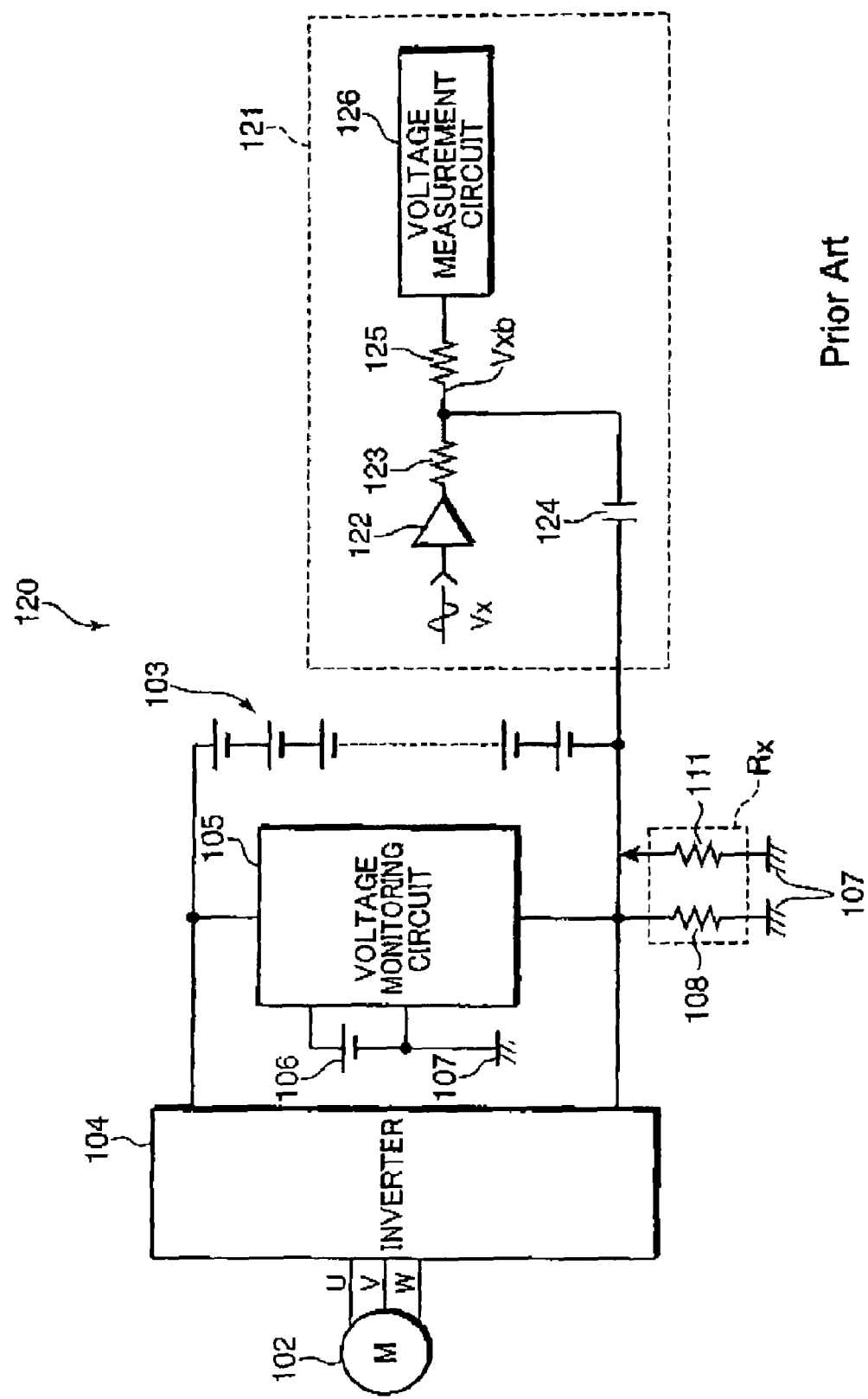
FIG. 7 is a circuit diagram, showing another ground-fault resistance measurement circuit according to the background art.

In addition, in the ground-fault resistance measurement circuit 121 according to the background art shown in FIG. 7, there is a disadvantage in that immediately after a ground fault is generated on the positive-electrode side of the secondary battery pack 103, the ground-fault resistance cannot be measured. This point will be described below.

FIG. 8 is a wave-form chart, showing a change in the division voltage value Vxb when the positive electrode of the secondary battery pack 103 undergoes a ground fault in the vehicle 120 shown in FIG. 7. First, in timing T101, a ground fault is not generated. The division voltage value Vxb has, for example, a frequency of 1 Hz, and is within a voltage range of 0 to 5 volts which corresponds to the input voltage range of the voltage measurement circuit 126.

Herein, in timing T102, in the secondary battery pack 103 which has, for example, a power of 400 volts, if its positive electrode is subjected to a ground fault, then an electrical potential becomes 0 volts at the secondary battery pack 103's positive electrode. On the other hand, an electrical potential becomes −400 volts at the secondary battery pack 103's negative electrode Thereby, for example, the ground-fault resistance is substantially equal to that of the resistance 123, for example, 100 kΩ. On condition that the capacitor 124's capacitance is, for example, 10 μF, the capacitor 124 comes to a low impedance the moment the ground fault has occurred. Therefore, the voltage of −400 volts is divided by the ground-fault resistance and the resistance 123, so that the division voltage value Vxb becomes approximately −200 volts. Hence, it goes out of the input voltage range of the voltage measurement circuit 126, thus making it impossible to calculate the ground-fault resistance. Thereafter, the division voltage value Vxb goes up gradually according to the charging time constant of the capacitor 124. Then, again, it comes within the input voltage range of the voltage measurement circuit 126, so that the division voltage value Vxb can be measured. Reference character tcx designates a charge recovery time until timing T103 when the ground fault can be calculated, which is about 8 seconds.

In sum, in the ground-fault resistance measurement circuit 121 shown in FIG. 7, shortly after a ground fault is generated on the positive-electrode side of the secondary battery pack 103, the capacitor 124 is charged according to its charging time constant. Thereby, a disadvantage arises in that a ground fault cannot be calculated for the charge recovery time tcx required for offsetting the division voltage value Vxb produced after the secondary battery pack 103's output voltage is divided by the ground-fault resistance and the resistance 123.

Figure 4:
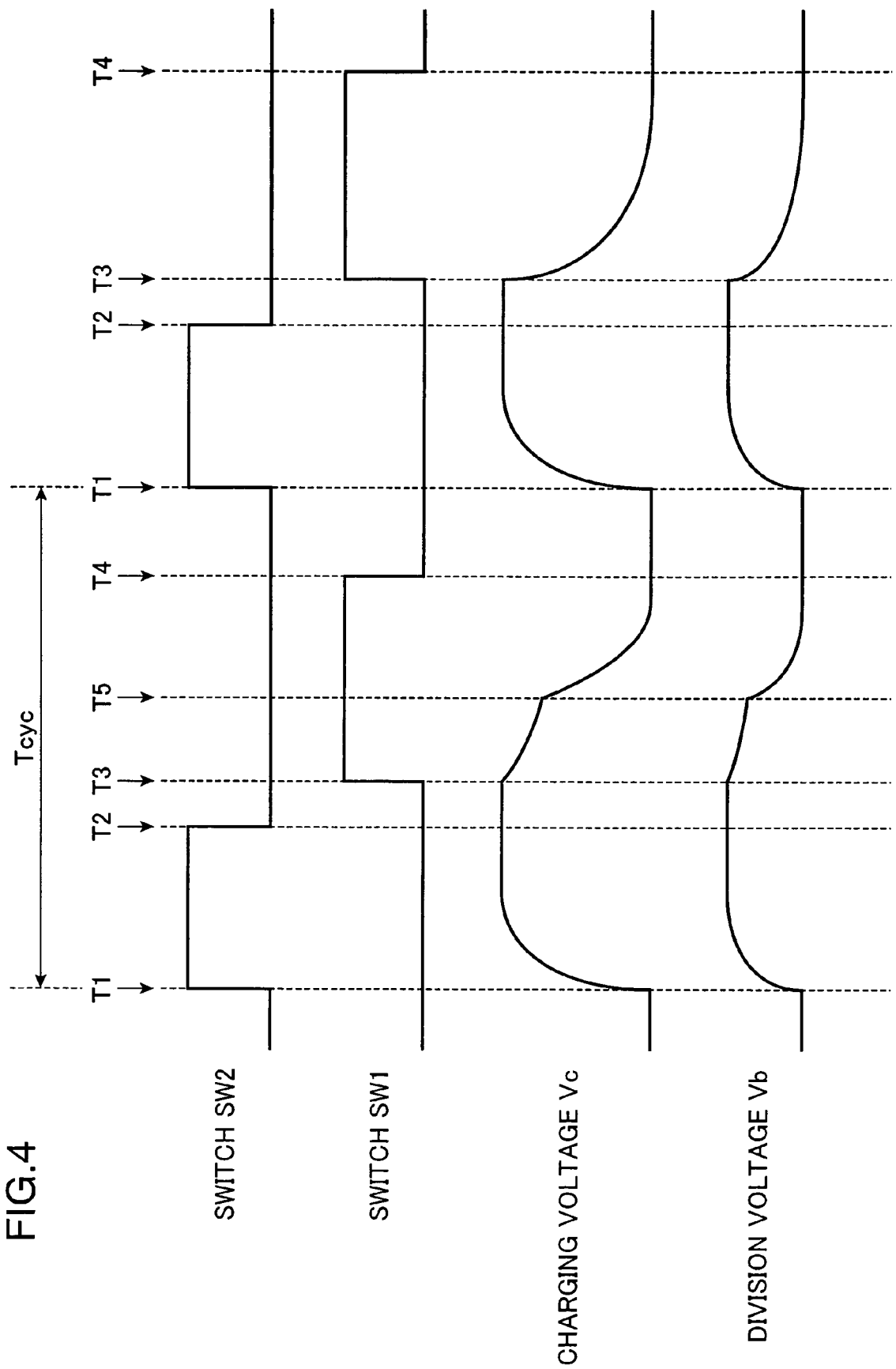
FIG. 4 is a timing chart, showing an operation of the ground-fault detection circuit when a ground fault occurs while the capacitor C1 shown in FIG. 1 is discharging.

In contrast, in the ground-fault detection circuit 2 shown in FIG. 1, for example, during the capacitor C1's discharge after the timing T3 shown in FIG. 2, for example, if a ground fault is generated in timing T5 shown in FIG. 4, the capacitor C1's discharge time constant becomes small. Thereby, the discharge curves of the charging voltage Vc and the division voltage Vb become sharp in the middle of the discharge. This makes it impossible to correctly calculate the ground-fault resistance RL's resistance. However, in the ground-fault detection circuit 2 shown in FIG. 1, as shown in FIG. 4, the processing of the timing T1 to T4 is repeated again, so that the ground-fault resistance RL's resistance can be correctly calculated.

In this case, a repetition cycle Tcyc of the timing T1 to T4 requires at least the time obtained by adding the charging time for the capacitor C1 in the timing T1 to T2 and the discharge time for the capacitor C1 in the timing T3 to T4. Herein, in the capacitor C1's discharge operation in the timing T1 to T2, the resistance between the charging power-source section 23 and the capacitor C1 is only the switch SW2's ON-resistance. In other words, it is extremely low. Hence, the charging time constant of the capacitor C1 is also extremely small, and thus, the charging time for the capacitor C1 in the timing T1 to T2 is nearly zero.

Furthermore, in the ground-fault detection circuit 2 shown in FIG. 1, the charging voltage Vc varies only from 0 volts to the charging power-source section 23's output voltage, for example, 12 volts, even though a ground fault occurs. Therefore, in the ground-fault resistance measurement circuit 121 shown in FIG. 7, in a period of time shorter than the charge recovery time tcx required for offsetting the division voltage value Vxb of approximately −200 volts by the capacity charge, the capacitor C1's discharge in the timing T3 to T4 can be easily completed.

Then, the repetition cycle Tcyc of FIG. 4 is set below the half of the charge recovery time tcx of FIG. 8, for example, at one second. Even if a ground fault is generated during the capacitor C1's discharge, then in the following timing T1 to T4, the ground-fault resistance RL's resistance can be correctly calculated. Therefore, the time taken for measuring the ground-fault resistance after the ground fault has been generated can be easily made shorter than that of the ground-fault resistance measurement circuit 121 shown in FIG. 7.

Incidentally, an example is given where in the timing T3, T31, T32 shown in FIG. 3, the calculation section 252 calculates the ground-fault resistance RL's resistance, based on the time (tb−ta) from the timing T31 when the division voltage Vb comes to or below the set voltage V1 until the timing T31 when the division voltage Vb comes to or below the set voltage V2 after the discharge control section 251 turns on the switch SW1. However, for example, the calculation section 252 may also calculate the resistance value $R_L$ in the following method. It acquires, as the voltage Vta (i.e., the first charging voltage), the division voltage Vb in the timing T31 when the time ta (i.e., the first set time) set in advance elapses from the timing T3 when the discharge control section 251 turns on the switch SW1. Then, it acquires, as the voltage Vtb (i.e., the second charging voltage), the division voltage Vb at the time when the time tb (i.e., the second set time) set in advance passes from the timing T31. Using the voltage Vta and the voltage Vtb, it calculates the resistance value $R_L$ on the basis of the above described expression (4).

In this case, without using the division voltage Vb in the timing T3 when the discharge control section 251 turns on the switch SW1, the division voltage Vb in the timing T31 when the time tsa elapses from the timing T3 is used as the voltage Vta. This helps lessen the influence of a switching noise made when the switch SW1 is turned on, and thus, improve the precision which the resistance value $R_L$ is calculated with. Besides, a ground fault sharpens the capacitor C1's electric discharge, and thus, the capacitor C1's discharge is completed before the times ta, tb elapse. Consequently, the division voltage Vb may be 0 volts, so that the resistance value $R_L$ cannot be calculated. In order to avoid this, the change in the division voltage Vb can be monitored after the discharge control section 251 turns on the switch SW1. Then, the times ta, tb may also be lengthened and shortened d according to the change rate in the division voltage Vb.

Figure 5:
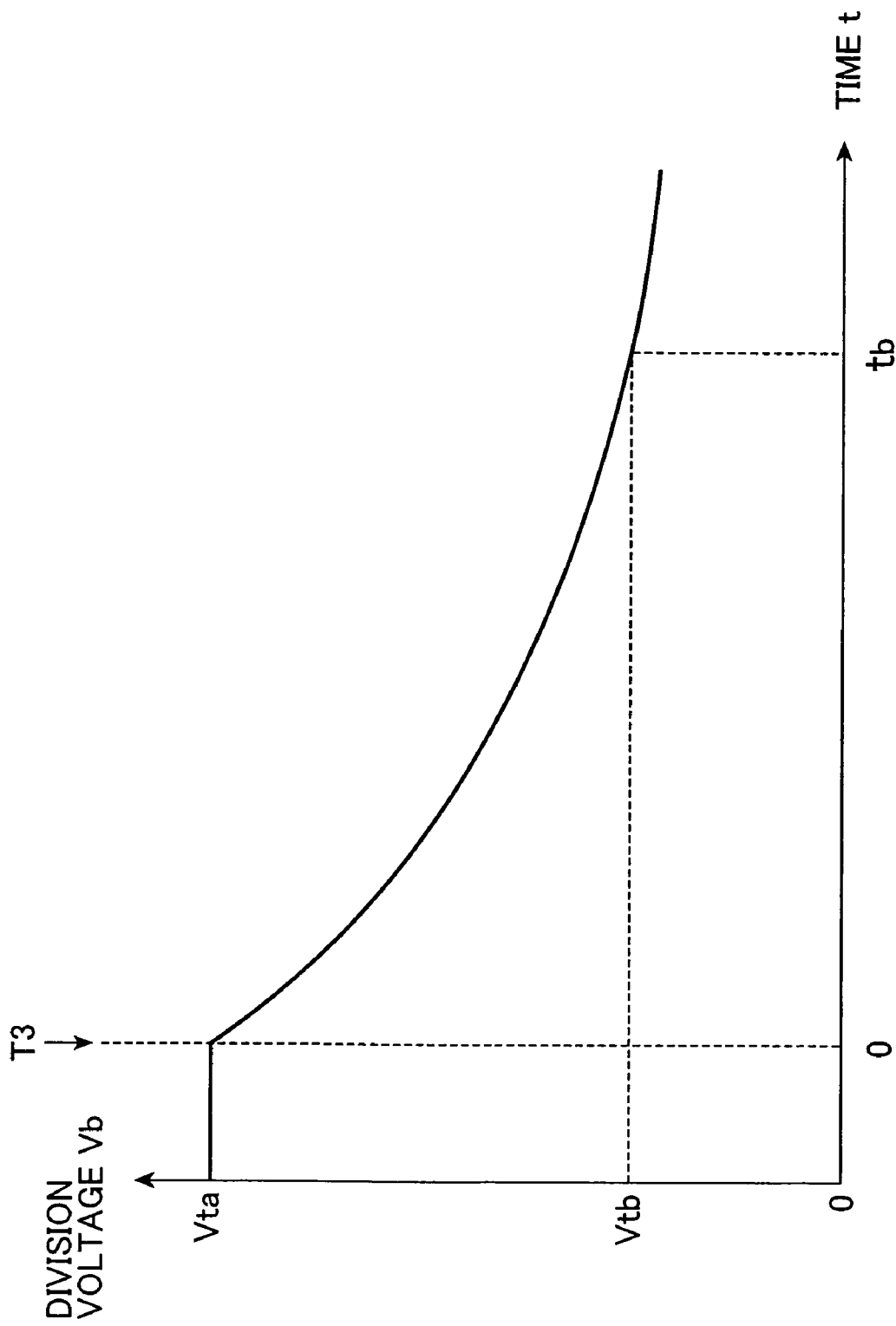
FIG. 5 is a graphical representation, showing a change in a division voltage when a capacitor discharges in a ground-fault detection circuit provided with a ground-fault resistance measurement circuit according to a variation of an embodiment of the present invention.

Moreover, for example, as shown in FIG. 5, the calculation section 252 may also calculate the resistance value $R_L$ in the above described expression (4). It acquires, as the voltage Vta, the division voltage Vb in the timing T3 (ta=0) when the discharge control section 251 turns on the switch SW1. Then, it acquires, as the voltage Vtb, the division voltage Vb at the time when the time tb set in advance passes from the timing T3. In this case as well, a ground fault sharpens the capacitor C1's electric discharge, and thus, the capacitor C1's discharge is completed before the time tb elapses. Consequently, the division voltage Vb may be 0 volts, so that the resistance value $R_L$ cannot be calculated. In order to avoid this, the change in the division voltage Vb can be monitored after the discharge control section 251 turns on the switch SW1. Then, the time tb may also be lengthened and shortened d according to the change rate in the division voltage Vb.

Incidentally, as an example of the charge section, the negative electrode of the secondary battery pack 11 is given. However, whatever can be used as the charge section, so long as it is a "live part" defined in JIS B 9960-1. For example, it may also be the positive electrode of the secondary battery pack 11, the circuit section of the inverter 12, the power-source line of three-phase power-source voltages U, V, W, or the like.

In addition, an example is given where the ground-fault resistance measurement circuit according to the present invention and the ground-fault detection circuit 2 provided with this are used for an electric automobile. However, they can be applied, for example, to another kind of electrical appliance, such as an air conditioner, a washing machine and a microwave oven, as long as a battery insulated from its frame body is used as the power source, or a commercial power source which has a grounded phase is used with kept insulated by an insulating transformer or the like. Furthermore, they may also be used as a ground-fault resistance detection apparatus and a ground-fault detection apparatus which measures and detects a ground-fault resistance, without embedded into any equipment.

The present invention relates to a ground-fault resistance measurement circuit which measures a ground-fault resistance between a charge section insulated from a conductive frame body of electrical equipment and the frame body, and a ground-fault detection circuit provided with this. Particularly, it can be desirably used as a ground-fault resistance measurement circuit for an electric automobile and a ground-fault detection circuit provided with this.

A ground-fault resistance measurement circuit according to the present invention, which measures a resistance between a charge section insulated from a conductive frame body of an electrical apparatus and the frame body, comprising: a capacitor which is connected between the charge section and the frame body; a first switch which opens and closes a connection path between the charge section and the capacitor; a charging unit which charges the capacitor, using a predetermined set voltage for charge; a voltage measurement section which measures a charging voltage of the capacitor; a discharge control section which closes the first switch after the charging unit charges the capacitor; and a calculation section which calculates a resistance between the charge section and the frame body, based on a change in the charging voltage measured by the voltage measurement section after the discharge control section closes the first switch.

In the ground-fault resistance measurement circuit according to the present invention, the charging unit charges the capacitor connected between the charge section and the frame body, and the discharge control section closes the first switch. Thereby, the capacitor discharges via a ground-fault resistance between the charge section and the conductive frame body. Thus, the capacitor's charging voltage varies according to a time constant based on the capacitor's capacitance and a ground-fault resistance. Then, the voltage measurement section measures the capacitor's charging voltage. Herein, the change in the charging-voltage measurement value obtained in the voltage measurement section corresponds to the time constant based on the capacitor's capacitance and the ground-fault resistance, so that the calculation section calculates the ground-fault resistance's resistance value. In this case, the ground-fault resistance is expressed using the logarithm of the charging-voltage measurement value obtained in the voltage measurement section. Therefore, a measurement error in the charging voltage has less effect, thus helping improve the measurement precision of a ground-fault resistance easily without using any constant-current circuit.

In the above described ground-fault resistance measurement circuit, it is preferable that the calculation section calculates a resistance between the charge section and the frame body, based on a charging voltage of the capacitor at the time when the discharge control section closes the first switch and a charging voltage measured by the voltage measurement section at the time when a predetermined set time elapses after closing the first switch.

According to this configuration, on the basis of a charging voltage of the capacitor at the time when the discharge control section closes the first switch, in other words, the set voltage for charge or the charging voltage measured by the voltage measurement section, and a charging voltage measured by the voltage measurement section at the time when a predetermined set time elapses after it closes the first switch so that the capacitor starts to discharge, the calculation section can detect a change in the charging voltage according to the time constant based on the capacitance and the ground-fault resistance. Therefore, from this change in the charging voltage, the calculation section can calculate a resistance between the charge section and the frame body.

In the above described ground-fault resistance measurement circuit, it is preferable that the calculation section calculates a resistance between the charge section and the frame body, based on a first charging voltage measured by the voltage measurement section at the time when a predetermined first set time elapses after the discharge control section closes the first switch and a second charging voltage measured by the voltage measurement section at the time when a predetermined second set time elapses after a lapse of the first set time.

According to this configuration, a first charging voltage is measured by the voltage measurement section at the time when the predetermined first set time elapses after the discharge control section closes the first switch to begin discharging according to the time constant based on the capacitor's capacitance and the ground-fault resistance. Therefore, a switching noise made when the first switch is closed is less likely to be measured as the first charging voltage. Then, a resistance between the charge section and the frame body is calculated based on a second charging voltage measured by the voltage measurement section at the time when a predetermined second set time elapses after the first set time passes and the first charging voltage. In this case, the switching noise is less likely to be measured as the first charging voltage. This helps improve the precision with which the ground-fault resistance value is measured.

In the above described ground-fault resistance measurement circuit, it is preferable that the ground-fault resistance measurement circuit further comprising: a clock section which clocks time, starting from a point of time when the charging voltage measured by the voltage measurement section after the discharge control section closes the first switch reaches a predetermined first set voltage, until a point of time when this charging voltage reaches a second set voltage lower than the first set voltage; wherein the calculation section calculates a resistance between the charge section and the frame body, based on the time clocked by the clock section.

According to this configuration, the discharge control section closes the first switch, and then, an electric discharge starts according to the time constant based on the capacitor's capacitance and the ground-fault resistance. Thereafter, the clock section clocks time from a point of time when the capacitor's charging voltage measured by the voltage measurement section reaches the predetermined first set voltage until a point of time when this charging voltage reaches the second set voltage lower than the first set voltage. Then, the calculation section calculates the ground-fault resistance between the charge section and the frame body, based on the time clocked by the clock section. Thereby, even if the ground-fault resistance is low and thus the discharge time constant is small, and accordingly, even though the capacitor's charging voltage drops rapidly, then in timing before the capacitor's charging voltage falls to 0 volts, the time can be clocked from the time when it reaches the first set voltage until the time when it reaches the second set voltage. Therefore, even if the ground-fault resistance is low, the ground-fault resistance value can be restrained from being wrongly measured. Besides, even if the ground-fault resistance is high and thus the discharge time constant is great, and accordingly, even though the capacitor's charging voltage changes slowly, then the ground-fault resistance value is calculated based on the time from a point when the capacitor's charging voltage reaches the first set voltage until a point when it reaches the second set voltage. Therefore, in the same way as the case where the ground-fault resistance value is calculated based on a change in the capacitor's charging voltage when a fixedly-set specific time elapses, there is little change in the charging voltage when the specific time passes. This helps keep the calculation of the resistance value from being deteriorated.

In the above described ground-fault resistance measurement circuit, it is preferable that the charging unit includes a charging power-source section which outputs the set voltage for charge, and a second switch which opens and closes a connection path between the charging power-source section and the capacitor; and the discharge control section close the second switch so that the charging power-source section charges the capacitor, and thereafter opens the second switch.

According to this configuration, the discharge control section closes the second switch so that the charging power-source section can charge the capacitor. Then, it opens the second switch after this charge, and thereby, the charging power-source section can be separated from the capacitor. Therefore, the capacitor can be restrained from discharging through a leakage current via the charging power-source section. As a result, the measurement precision of the ground-fault resistance can be enhanced.

In the above described ground-fault resistance measurement circuit, it is preferable that a resistance is disposed on a path from the capacitor through the first switch to the charge section.

According to this configuration, when an electric charge to the capacitor is discharged through the first switch, the charge section and the ground-fault resistance to the frame body, the discharge current is restricted by the resistances. Therefore, even if a user touches the frame body, an electric current which passes through the user's body is limited, thus preventing the user from getting an electric shock and feeling uncomfortable.

In the above described ground-fault resistance measurement circuit it is preferable that the ground-fault resistance measurement circuit further comprising: a voltage-division resistance which divides a charging voltage of the capacitor; wherein the voltage measurement section measures a division voltage obtained from the voltage division by the voltage-division resistance.

According to this configuration, the division voltage obtained from the division of the capacitor's charging voltage is applied to the voltage measurement section. Therefore, the voltage applied to the voltage measurement section is kept within the input voltage range measurable by the voltage measurement section, and simultaneously, the capacitor's charging voltage can be raised up to a voltage beyond the input voltage range of the voltage measurement section Then, if the capacitor's charging voltage is heightened, the influence of a noise lessens relatively to the charging voltage. Therefore, the influence of a noise can be reduced, thus enhancing the measurement precision of the ground-fault resistance.

In the above described ground-fault resistance measurement circuit, it is preferable that the ground-fault resistance measurement circuit further comprising: a display section which displays a resistance calculated by the calculation section.

According to this configuration, the resistance calculated by the calculation section is displayed by the display section. Therefore, a user can be notified of the ground-fault resistance value.

In the above described ground-fault resistance measurement circuit, it is preferable that the electrical apparatus includes a battery insulated from the frame body; and the charge section is an electrode of the battery.

According to this configuration, in an apparatus where a battery insulated from the frame body is used as its power source, the ground-fault resistance can be measured when this battery is grounded via the frame body.

In the above described ground-fault resistance measurement circuit, it is preferable that the electrical apparatus is an electric automobile, the battery supplies electric power to a mechanical-power motor of the electric automobile; and the frame body is the body of the electric automobile.

According to this configuration, when the high-voltage charge section used for the motor drive of an electric automobile is grounded to the automobile's body, the ground-fault resistance can be measured.

A ground-fault detection circuit according to the present invention, comprising: any ground-fault resistance measurement circuit described above; and a decision section which decides that a ground fault is generated if the resistance calculated by the calculation section is below a predetermined threshold value.

According to this configuration, if the ground-fault resistance value calculated by the calculation section in the ground-fault resistance measurement circuit is below the predetermined threshold value, the decision section decides that a ground fault has been generated. Therefore, a ground fault can be detected being generated.

In the above described ground-fault detection circuit, it is preferable that the ground-fault detection circuit further comprising: a notification section which gives notice of a decision result by the decision section.

According to this configuration, the notification section gives notice of a decision result by the decision section. Therefore, a user can be notified that a ground fault has occurred.

This application is based on Japanese patent application serial No. 2006-020063, filed in Japan Patent Office on Jan. 30, 2006, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A ground-fault resistance measurement circuit which measures a resistance between a charge section insulated from a conductive frame body of an electrical apparatus and the frame body, comprising:
   a capacitor which is connected between the charge section and the frame body;
   a first switch which opens and closes a connection path between the charge section connected to the capacitor and the capacitor;
   a charging power-source section which outputs a predetermined set voltage for charge;
   a charging unit which charges the capacitor, using the predetermined set voltage output from the charging power-source section;
   a voltage measurement section which measures a charging voltage of the capacitor;
   a discharge control section which closes the first switch after charging the capacitor by the charging unit; and
   a calculation section which calculates a resistance value between the charge section and the frame body, based on a change in the charging voltage measured by the voltage measurement section after closing the first switch by the discharge control section.

2. The ground-fault resistance measurement circuit according to claim 1, wherein the calculation section calculates a resistance value $R_L$ between the charge section and the frame body, based on a value Vta indicative of a charging voltage of the capacitor as measured by the voltage measurement section at the time when the discharge control section closes the first switch and a value Vtb indicative of a charging voltage measured by the voltage measurement section at the time when a predetermined set time tb elapses after closing the first switch.

3. The ground-fault resistance measurement circuit according to claim 2, further comprising:
   a first resistance having a first resistance value $R_1$ disposed on a path from the capacitor to the charge section via the first switch; and
   second and third resistances having a second resistance value $R_2$ and a third resistance value $R_3$, respectively, which serve as voltage dividing resistances for dividing a charge voltage of said capacitor, wherein:
   said voltage measurement section measures, as the charge voltage, a divided voltage divided by the voltage dividing resistances, and
   said calculation section calculates the resistance value $R_L$ based on the electrostatic capacity $C_1$ of the capacitor and from the following expression:

$$R_L = \tau \times (R_2+R_3)/\{C_1 \times (R_2+R_3)-\tau\}-R_1,$$

where $\tau = tb/(\log Vta - \log Vtb)$.

4. The ground-fault resistance measurement circuit according to claim 1, wherein the calculation section calculates a resistance value $R_L$ between the charge section and the frame body, based on a first charging voltage Vta measured by the voltage measurement section at the time when a predetermined first set time ta elapses after the discharge control section closes the first switch and a second charging voltage Vtb measured by the voltage measurement section at the time when a predetermined second set time tb elapses after a lapse of the predetermined first set time.

5. The ground-fault resistance measurement circuit according to claim 4, further comprising:
   a first resistance having a first resistance value $R_1$ disposed on a path from the capacitor to the charge section via the first switch; and
   second and third resistances having a second resistance value $R_2$ and a third resistance value $R_3$, respectively, which serve as voltage dividing resistances for dividing a charge voltage of said capacitor, wherein:
   said voltage measurement section measures, as the charge voltage, a divided voltage divided by the voltage dividing resistances, and
   said calculation section calculates the resistance value $R_L$ based on the electrostatic capacity $C_1$ of the capacitor and from the following expression:

$$R_L = \tau \times (R_2+R_3)/\{C_1 \times (R_2+R_3)-\tau\}-R_1,$$

where $\tau = (ta-tb)/(\log Vta - \log Vtb)$.

6. The ground-fault resistance measurement circuit according to claim 1, further comprising:
   a clock section which clocks time ta starting from a point of time when the discharge control section closes the first switch until a point of time the charging voltage measured by the voltage measurement section reaches a first predetermined set voltage V1 or below, and a time tb starting from a point of time when the discharge control section closes the first switch until a point of time the charging voltage measured by the voltage measurement section reaches a second predetermined set voltage V2 or below, said second predetermined set voltage V2 being lower than said first predetermined set voltage V1, wherein,
  the calculation section calculates a resistance value $R_L$ between the charge section and the frame body, based on the time clocked by the clock section.

7. The ground-fault resistance measurement circuit according to claim 6, further comprising:
  a first resistance having a first resistance value $R_1$ disposed on a path from the capacitor to the charge section via the first switch; and
  second and third resistances having a second resistance value $R_2$ and a third resistance value $R_3$, respectively, which serve as voltage dividing resistances for dividing a charge voltage of said capacitor, wherein:
  said voltage measurement section measures, as the charge voltage, a divided voltage divided by the voltage dividing resistances, and
  said calculation section calculates the resistance value $R_L$ based on the electrostatic capacity $C_1$ of the capacitor and from the following expression:

$$R_L = \tau \times (R_2 + R_3) / \{C_1 \times (R_2 + R_3) - \tau\} - R_1,$$

where $\tau = (tb - ta)/(\log V1 - \log V2)$.

8. The ground-fault resistance measurement circuit according to claim 1, wherein,
  the charging unit includes a second switch which opens and closes a connection path between the charging power-source section and the capacitor, and
  the discharge control section closes the second switch so that the charging power-source section charges the capacitor, and thereafter opens the second switch.

9. The ground-fault resistance measurement circuit according to claim 1, wherein a resistance is disposed on a path from the capacitor through the first switch to the charge section.

10. The ground-fault resistance measurement circuit according to claim 1, further comprising:
  a voltage-division resistance which divides a charging voltage of the capacitor;
  wherein the voltage measurement section measures a division voltage obtained from the voltage division by the voltage-division resistance.

11. The ground-fault resistance measurement circuit according to claim 1, further comprising:
  a display section which displays a resistance value calculated by the calculation section.

12. The ground-fault resistance measurement circuit according to claim 1, wherein:
  the electrical apparatus includes a battery insulated from the frame body; and
  the charge section is an electrode of the battery.

13. The ground-fault resistance measurement circuit according to claim 12, wherein:
  the electrical apparatus is an electric automobile;
  the battery supplies electric power to a mechanical-power motor of the electric automobile; and
  the frame body is a body of the electric automobile.

14. A ground-fault detection circuit, comprising:
  the ground-fault resistance measurement circuit according to claim 1; and
  a decision section which decides that a ground fault is generated if the resistance value calculated by the calculation section is below a predetermined threshold value.

15. The ground-fault detection circuit according to claim 14, further comprising, a notification section which gives notice of a decision result by the decision section.

* * * * *